United States Patent
Jindal et al.

(10) Patent No.: US 8,399,868 B2
(45) Date of Patent: Mar. 19, 2013

(54) TOOLS, METHODS AND DEVICES FOR MITIGATING EXTREME ULTRAVIOLET OPTICS CONTAMINATION

(75) Inventors: Vibhu Jindal, Albany, NY (US); Andrea Wüest, Zurich (CH)

(73) Assignee: Sematech Inc.

( * ) Notice: Subject to any disclaimer, the term of this patent is extended or adjusted under 35 U.S.C. 154(b) by 0 days.

(21) Appl. No.: 13/027,804

(22) Filed: Feb. 15, 2011

(65) Prior Publication Data

US 2012/0205558 A1 Aug. 16, 2012

(51) Int. Cl.
*C23F 1/00* (2006.01)
*H01L 21/306* (2006.01)

(52) U.S. Cl. ................................. 250/504 R; 355/30

(58) Field of Classification Search .............. 250/504 R; 355/30
See application file for complete search history.

(56) References Cited

U.S. PATENT DOCUMENTS

| | | | | |
|---|---|---|---|---|
| 6,593,036 | B1 * | 7/2003 | Robic et al. | 430/5 |
| 6,642,531 | B1 * | 11/2003 | Powers | 250/492.2 |
| 7,060,993 | B2 * | 6/2006 | Wedowski et al. | 250/492.2 |
| 7,116,394 | B2 * | 10/2006 | Bakker et al. | 355/30 |
| 7,147,722 | B2 | 12/2006 | Klebanoff et al. | 134/1 |
| 7,309,871 | B2 * | 12/2007 | Bowering | 250/504 R |
| 7,361,918 | B2 * | 4/2008 | Akins et al. | 250/504 R |
| 7,388,220 | B2 * | 6/2008 | Fomenkov et al. | 250/504 R |
| 7,462,842 | B2 * | 12/2008 | Wedowski et al. | 250/492.2 |
| 8,075,732 | B2 * | 12/2011 | Partlo et al. | 156/345.35 |
| 8,147,647 | B2 * | 4/2012 | Schriever | 156/345.43 |
| 2008/0087840 | A1 * | 4/2008 | Ueno et al. | 250/396 ML |
| 2010/0032590 | A1 * | 2/2010 | Bykanov et al. | 250/504 R |
| 2011/0043774 | A1 * | 2/2011 | Hembacher et al. | 355/30 |

OTHER PUBLICATIONS

Bajt et al., "Oxidation resistance and microstructure of ruthenium-capped extreme ultraviolet lithography multilayers," *J. Microlith. Microfab. Microsyst.*, 5, 023004, 2006.
Boller et al., "Investigation of carbon contamination of mirror surfaces exposed to synchrotron radiation," *Nucl. Inst. Meth.*, 208:273-279, 1983.
Graham et al., "Atomic hydrogen cleaning of EUV multilayer optics," *Proc. SPIE*, 5037:460-469, 2003.
Gubbini et al., "On-line cleaning of optical components in a multi TW-Ti-Sa laser system," *Vacuum*, 76: 45-49, 2004.
Hollensead and Klebanoff, "Modeling radiation-induced carbon contamination of extreme ultraviolet optics," *J. Vac. Sci. Tech. B.*, 24:64-82, 2006.
Kakutani et al., "Carbon deposition in multi-layer mirrors by extreme ultraviolet radiation," *Proc. SPIE*, 6517:651731, 2007.
Klebanoff et al., "Modeling EUV-induced Carbon Contamination of EUV Optics," EUV Optics Modeling Workshop, 2008.
Maddey et al., "Surface phenomena related to the degradation of extreme ultraviolet (EUV) mirrors," SEMATECH TD#25 LITH 160, 2005.
Nii et al., "Performance of Cr mask for extreme ultraviolet lithography," *Proc. SPIE*, 4409: 0227-786X, 2001.
Sasa et al., "Oxidation resistance and microstructure of ruthenium-capped extreme ultraviolet lithography multilayers," *J Microlith Microfab.*, 5: 023004, 2006.
Tanaka et al, "Cleaning characteristics of contaminated imaging optics using 172 nm radiation," *Jpn. J. Appl. Phys.*, 46:6150, 2007.

* cited by examiner

*Primary Examiner* — David A Vanore
(74) *Attorney, Agent, or Firm* — Fulbright & Jaworski LLP

(57) ABSTRACT

Devices, tools, and methods for mitigating contamination of an optics surface used in extreme ultraviolet (EUV) applications disclosed. The method may include providing an optically reflective surface configured to reflect EUV radiation. The method may further include exposing the optically reflective surface to EUV radiation thereby generating electrons. The method may also include applying an electromagnetic field to the optically reflective surface, the electromagnetic field configured to reduce reactions initiated by the electrons on the optically reflective surface. The applied electromagnetic field may be constant or varied and also may have different biases.

20 Claims, 7 Drawing Sheets

TOOLS, METHODS AND DEVICES FOR MITIGATING EXTREME ULTRAVIOLET OPTICS CONTAMINATION

BACKGROUND OF THE INVENTION

1. Field of the Invention

This invention relates generally semiconductor fabrication techniques. More particularly, but not by way of limitation, this invention relates to tools, methods, and devices for mitigation of extreme ultraviolet (EUV) optics contamination—the EUV optics that may be used in EUV lithography applications.

2. Description of the Related Art

Lithography is a process commonly used in semiconductor fabrication. Generally, lithography requires the use of light radiation to transfer a pattern on to the surface of a substrate. The particular surface may include a light-sensitive chemical (e.g., photoresist), and through one or more chemical treatments the pattern can be transferred, deposited, and/or etched on to the substrate.

EUV lithography uses extreme ultraviolet radiation as a light source. EUV light, having a wavelength of approximately 13.5 nm (e.g., in the range of 13-14 nm), may be absorbed by all types of matter, and as such, the optics used to transfer the EUV light on the surface of the semiconductor substrate may be contaminated through carbonization and/or oxidation. Moreover, in the presence of EUV light radiation, carbonization and/or oxidation reactions may be initiated on the surface of the EUV optic by either photons, electrons, holes, and/or excitons.

For example, FIG. 1 illustrates the potential contamination of EUV optic 103 in more detail. As shown, light source 101 produces EUV light radiation and photons 102. As depicted by the zig-zag line, these photons 102 may be absorbed into the surface of EUV optic 103. As described by the photoelectric effect, the photoabsorbed photons may produce one or more electrons/holes 104. The generated electrons/holes may either (1) not reach the surface at all (depending on the energy of the electron/hole and the distance to the surface), (2) reach the surface without scattering, (3), reach the surface after elastic scattering, and/or (4) reach the surface after inelastic scattering. Particularly with respect to inelastic scattering, the generated electrons/holes (e.g., primary electrons) may lose energy and generate another electron (e.g., secondary electrons) which may be ejected from the atom where the scattering takes pace. The incoming photons, having a kinetic energy of approximately 93 eV, may generate primary electrons/holes having a maximal kinetic energy of 90 eV (i.e., the 92 eV associated with the incoming photon minus the binding energy of a valence electron). The majority of electrons/holes that reach the optics surface, however, have kinetic energies below 20 eV.

The photons and electrons/holes produced by these photon induced reactions and secondary electron induced reactions may interact with the molecules on and around the surface of the EUV optic 103. Specifically, a carbonization reaction with hydrocarbons 106 can react to produce physically adsorbed hydrocarbons 108. These physically adsorbed hydrocarbons 108 can subsequently produce contaminant layer 105 (e.g., a growing carbonaceous film). Additionally, an oxidation reaction with residual water molecules 107 may also contaminate the EUV optics and add to contaminant layer 105.

Several solutions have been suggested to reduce the contamination of the EUV optics created by the EUV light radiation. These solutions, however, may only partially solve the contamination problem or may be very costly. For example some have suggested cleaner practice. EUV lithography is generally performed in situ (e.g., in a vacuum), and some contamination may be reduced simply by reducing the residual water vapor and hydrocarbons present. No solution has been presented that can eliminate the residual water vapor and/or hydrocarbons, and thus, such a solution has proved lacking.

Several solutions propose cleaning the EUV optics. For example, an in-situ and/or ex-situ etching processes have been proposed. See e.g., Gubbini et al., "'On-line' cleaning of optical components in a multi TW-Ti:Sa laser system," *Vacuum*, 76, 45 (2004); Klebanoff et al., "Method for in-situ cleaning of carbon contaminated surface," U.S. Pat. No. 7,147,722 (2006); Kakutani et al, "Carbon Deposition in multi-layer mirrors by extreme ultraviolet radiation," *Proc. SPIE*, 6517, 651731 (2007); Nii et al., "Performance of Cr mask for extreme ultraviolet lithography," *Proc. SPIE*, 4409, 0227-786X (2001). Additionally, an in-situ/ex-situ atomic hydrogen and/or molecular oxygen cleaning solution has been proposed. See e.g., Graham et al., "Atomic hydrogen cleaning of EUV multilayer optics," *Proc. SPIE*, 5037, 460 (2003). Also, an ex-situ laser exposure solution has been proposed. See e.g., Tanaka et al., "Cleaning Characteristics of Contaminated Imaging Optics Using 172 nm Radiation," *Jpn. J. Appl. Phys.*, 46, 6150 (2007). These cleaning solutions may have unintended side-effects. For example, these solutions may actually enhance the oxidation of residual water vapor. The cleaning methods as referenced above can affect the capping layer properties of an EUV optic—the use of a capping layer is discussed in more detail below. The degradation of the EUV capping layer due to the cleaning may decrease the reflectivity of the multilayers with time and thus reduce the lifetime of EUV optics. Furthermore, these cleaning solutions may require the removal of one or more EUV optics from the system so that they may be cleaned. Such a requirement could considerably increase time and cost.

Other solutions propose the use and/or modification of a capping layer to be used on the surface of the EUV optics. See e.g., Saša Bajt et al., "Oxidation resistance and microstructure of ruthenium-capped extreme ultraviolet lithography multilayers", *J. Microlith., Microfab., Microsyst.*, 5, 023004 (2006). Ru is currently accepted and utilized as industry wide capping layer for EUV optic. The oxidation of Ru capped EUV optic is decreased but carbon contamination is still an existing problem for Ru capped EUV optic. Carbon growth on Ru capped EUV optic is widely reported in literature however oxidation can also be seen on Ru capped EUV optic but at slower rates.

SUMMARY OF THE INVENTION

Devices, tools, and methods for mitigating contamination of an optics surface used in extreme ultraviolet (EUV) applications disclosed. The method may include providing an optically reflective surface configured to reflect EUV radiation. The method may further include exposing the optically reflective surface to EUV radiation thereby generating electrons. The method may also include applying an electromagnetic field to the optically reflective surface, the electromagnetic field configured to reduce reactions initiated by the electrons on the optically reflective surface. The applied electromagnetic field may be constant, pulsed, or varied and also may have different biases.

In some embodiments, the electromagnetic field may have a forward bias, and in alternative embodiments, the electromagnetic field may have a reverse bias. In some embodiments, the electromagnetic field may have an alternating bias (e.g., alternating forward and reverse bias).

Embodiments of an EUV tool configured to mitigating contamination of an optics surface may include an EUV radiation source. Embodiments of the tool may also include an optically reflective surface configured to reflect EUV radiation. Additionally, embodiments of the tool may also include an electromagnetic source communicatively coupled to the optically reflective device and configured to provide an electromagnetic field that reduces contamination on the optically reflective surface by applying an electromagnetic field.

Embodiments of the optically reflective device configured to reduce contamination on its optics surface may include a top surface, a bottom surface, and a body structure. Embodiments of the optically reflective device may have the top surface configured to be communicatively coupled to an electromagnetic source configured to reduce contamination on the top surface by applying an electromagnetic field, and reflect EUV radiation. Furthermore, in some embodiments, the body structure may comprise interleaved layers of silicon and molybdenum.

In some embodiments, the top surface and/or the bottom surface may further be configured to include one or more electrical contacts connecting the top surface to the electromagnetic source. In some embodiments, the top surface may include an annular contact configured to connect to the electromagnetic source.

In some embodiments, the optically reflective device may also include a capping layer.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Methods, tools, and devices are disclosed that are configured to reduce contamination of EUV optics through the introduction of an electromagnetic field. An electromagnetic field produced on and/or around the EUV optics may reduce the contamination rate at the optics surface. The presence of electromagnetic fields may reduce the flux of electrons/holes reaching the optics surface by either changing the electron/hole trajectory and/or reducing its kinetic energy. This reduction in electron/hole flux decreases the number of surface reactions initiated, and thus reduces contamination at the surface of the EUV optics.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 2:
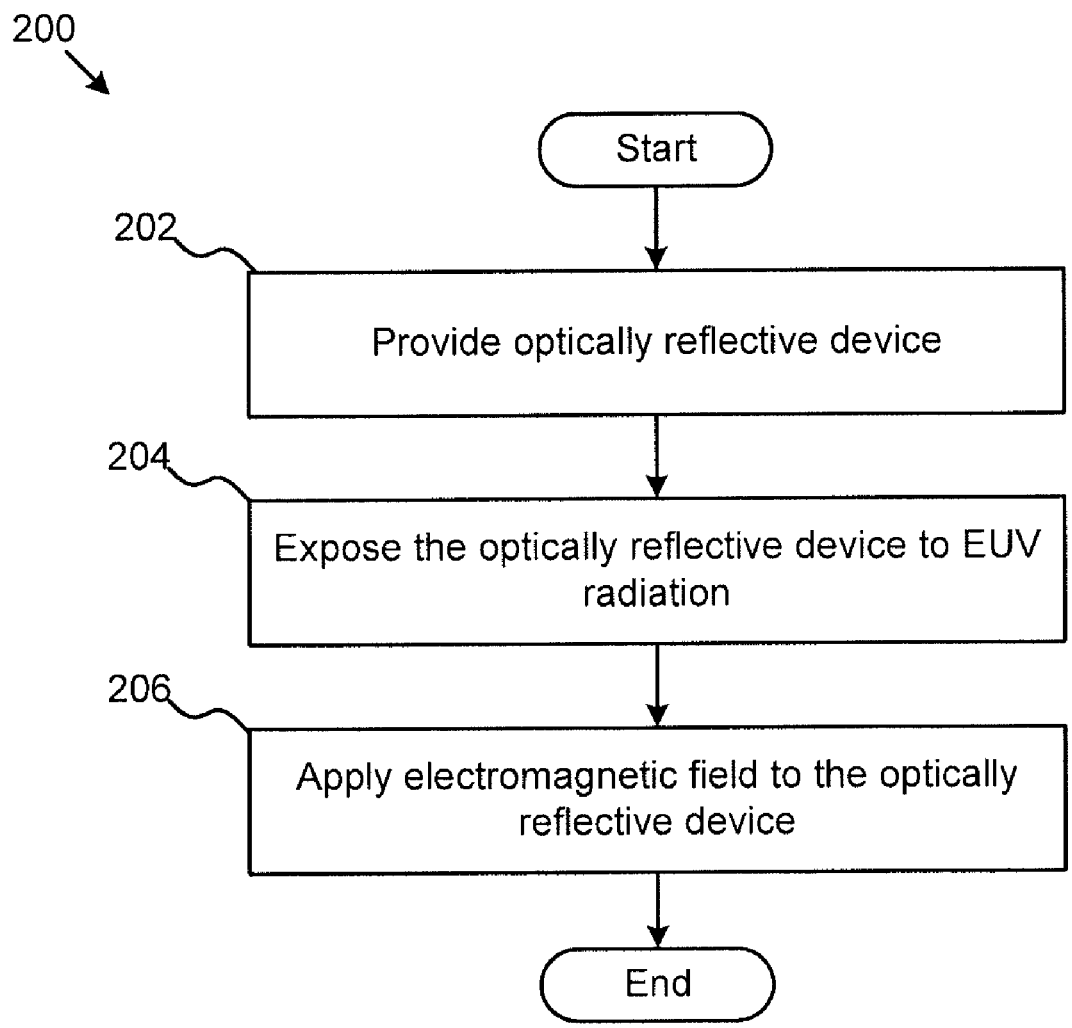
FIG. 2 is a schematic flow chart diagram illustrating one embodiment of a method for mitigating EUV optics contamination.
Figure 3:
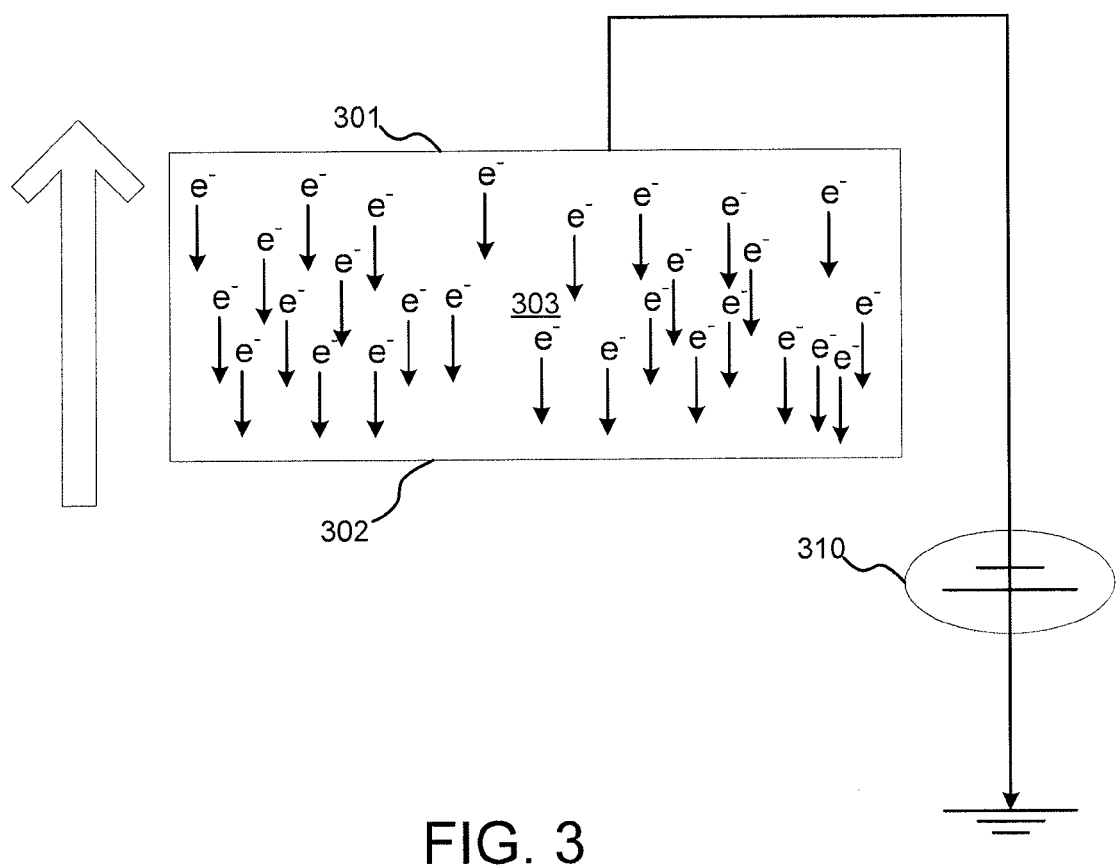
FIG. 3 illustrates an embodiment of applying an electric field to an EUV optic surface.
Figure 4:
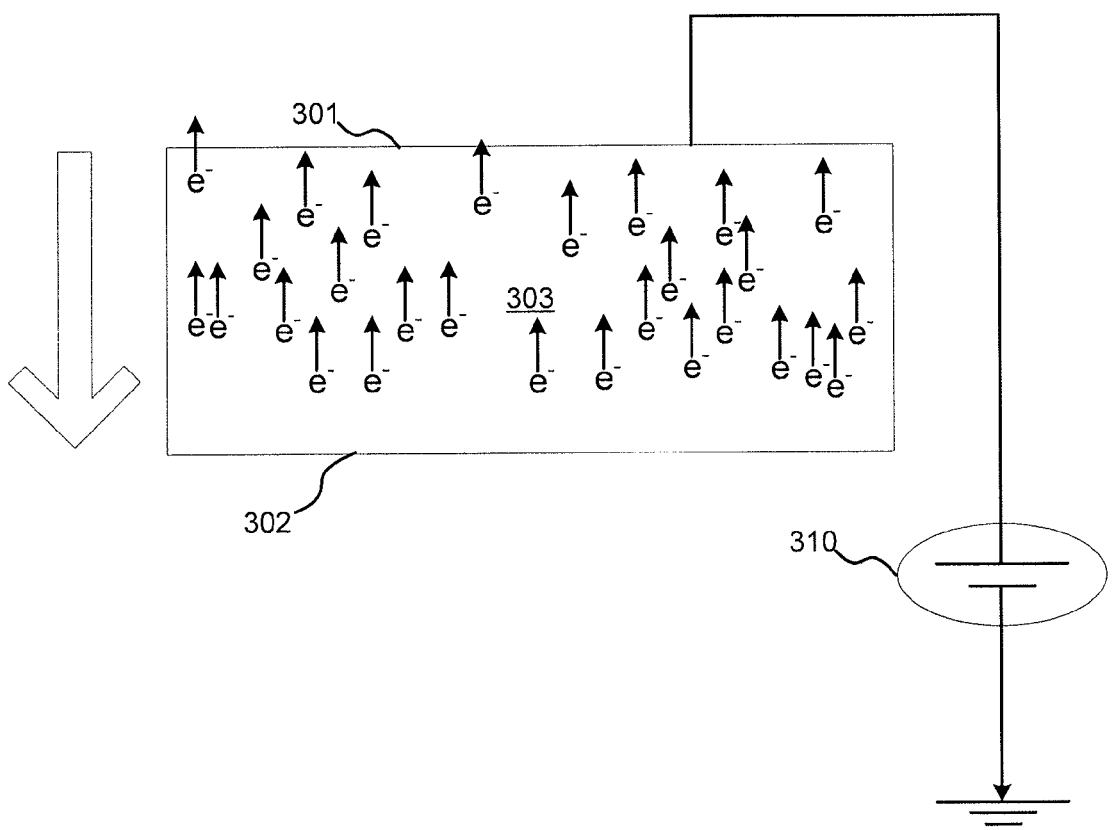
FIG. 4 illustrates an additional embodiment of applying an electric field to an EUV optic surface.
Figure 5:
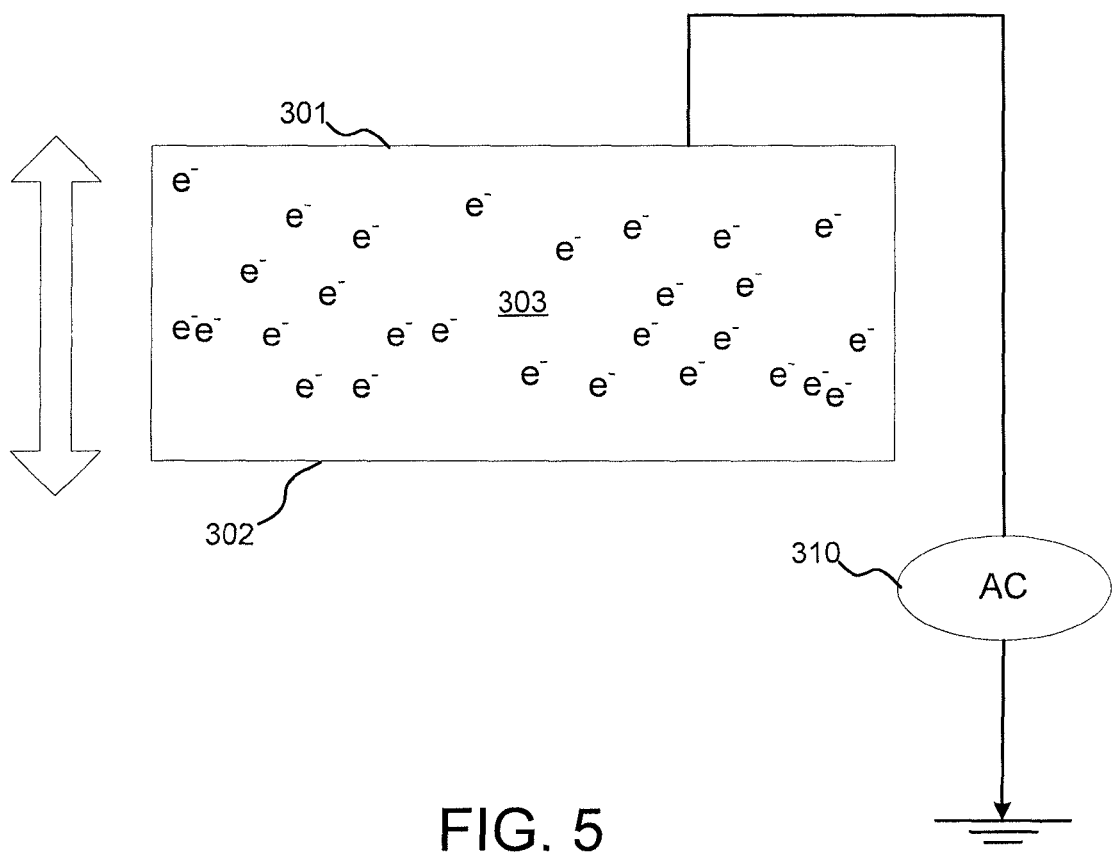
FIG. 5 illustrates an additional embodiment of applying an electric field to an EUV optic surface.

Referring to FIG. 2, the method 200 may begin by providing 202 an optically reflective surface configured to reflect EUV radiation. The optically reflective surface may be contained within a larger EUV tool (e.g., an EUV lithography tool). Such an EUV tool may further include several optically reflective devices each having an optically reflective surface as well as an EUV radiation source. FIGS. 3, 4, and 5 provide an illustration of an embodiment of an optically reflective device 303 having an optically reflective surface. Such an optically reflective device may have a top surface 301, bottom surface 302, and body structure. In some embodiments, the body structure may include interleaved layers of silicon and molybdenum with patterned structure of metal and insulator material on top and bottom of the body structure. For that matter, those of skill in the art will recognizes other suitable metal and insulator layers that may be patterned to form the reflective surface of an EUV optic. These interleaved layers within the body structure create the optically reflective surface of the optically reflective device. The patterned metal and insulator material on top and bottom of the body structure will provide the fields and assist in changing the field lines (electric and magnetic) within the body structure. In some embodiments, the device may have approximately 40 interleaved layers of molybdenum and silicon. Additionally, the device may further include a capping layer as the top layer. This capping layer helps prevent the degradation of the interleaved layers. For example, the capping layer may include a metal such as ruthenium, rutheniumdioxide, titaniumdioxide, graphitic carbon, and other like materials. More details regarding the optically reflective device are discussed in more detail with respect to FIG. 6.

Referring back to FIG. 2, the method 200 may proceed by exposing 204 the optically reflective surface to EUV radiation. As discussed earlier, when an EUV optics surface is exposed to EUV radiation, primary and secondary electrons/holes may be generated through the photoelectric effect. In some embodiments, the exposure of the EUV optics surface to EUV light radiation may be a necessary step in an EUV lithography process. This disclosure, however, is not limited strictly to EUV lithography, and the tools, methods, and devices presented here may be applied to other applications that reflect EUV light radiation.

In some embodiments, the method 200 may also include applying 206 an electromagnetic field to the optically reflective surface. The electromagnetic field may be configured to reduce reactions initiated by the electrons on the surface of the optically reflective surface. Moreover, reducing the surface reactions on the optically reflective surface reduces the contamination (e.g., caused by carbonization and/or oxidation) on the optically reflective surface. The electromagnetic field may be an electric field, a magnetic field, or both types of fields simultaneously. Moreover, the electromagnetic field may be constant, pulsed, or have varying biases. In an embodiment with a pulsed electromagnetic field, a variable pulse length with varying duty cycle may also be used. The magnitude of the electromagnetic field may also be varied. The effective bias on the top and bottom of the structure, producing electromagnetic field can vary from 100V to 1kV (including all ranges and values in between) based on the size and design of the EUV optic.

In some embodiments, the electromagnetic field may have a reverse bias and/or a forward bias. FIG. 3 provides an illustration of an applied electromagnetic field with a reverse bias—applied by an electromagnetic source 310 (e.g., a power source, a current source, magnetic field generator, and the like). As depicted by the large arrow, the direction of the electromagnetic field having a reverse bias may be towards the top surface 301 of the electromagnetic device 303. An electromagnetic field having a reverse bias may reduce the flux of the electrons/holes reaching the top surface 301 of the electromagnetic device 303 because such a reverse bias may change the trajectory of the electrons/holes towards the bottom surface 302. FIG. 4 provides an illustration of an electromagnetic field having a forward bias. As depicted, in some embodiments, the direction of the electromagnetic field may be towards the bottom surface 302. An electromagnetic field having a forward bias may change the trajectory of the electrons/holes towards the top surface 301. In such an embodiment, the flux of electrons from the surface may be swept away as a leakage current before contamination through oxidation/carbonization.

As depicted in FIG. 5, in some embodiments, the electromagnetic field may also have an alternating bias. An alternating bias (e.g., alternating between a forward bias and a reverse bias); may make the electrons/holes stagnant. Thus, the electrons/holes may lose energy at their current position and may not have enough energy left to travel to reach the surface. In embodiments having an alternating bias, the frequency of the shift from forward to reverse may vary. The frequency of the duty cycle can vary from 50 Hz to 1 kHz (including all ranges and values in between) based on the intensity of EUV radiation on the EUV optic, design and size of EUV optic.

Figure 6A:
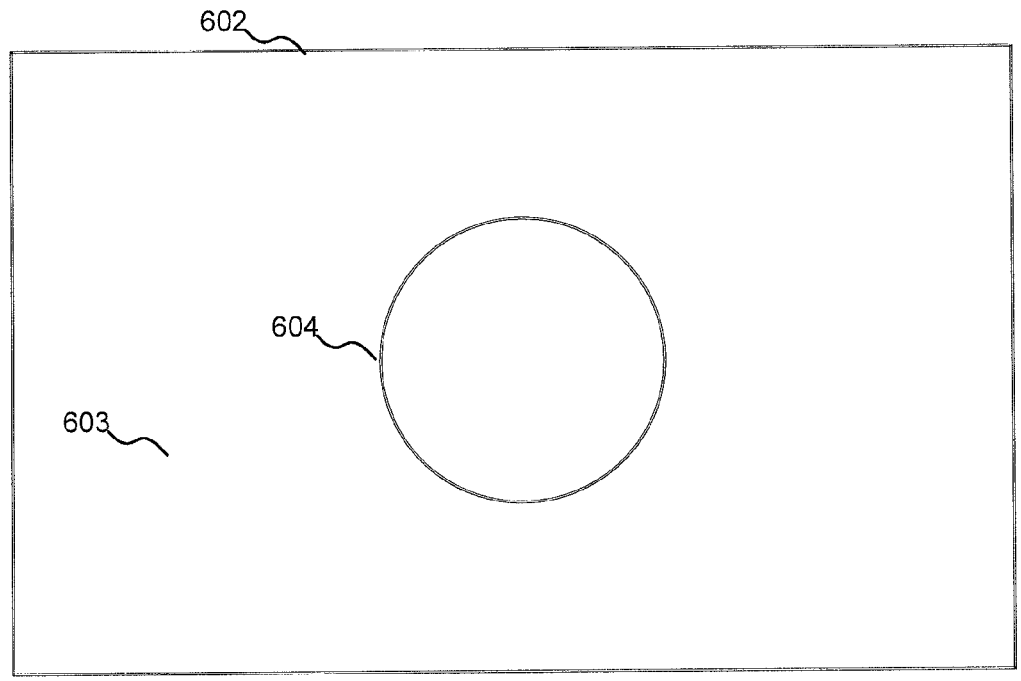
FIGS. 6A-6C illustrate embodiments of the front and back of an optical surface.
Figure 6B:
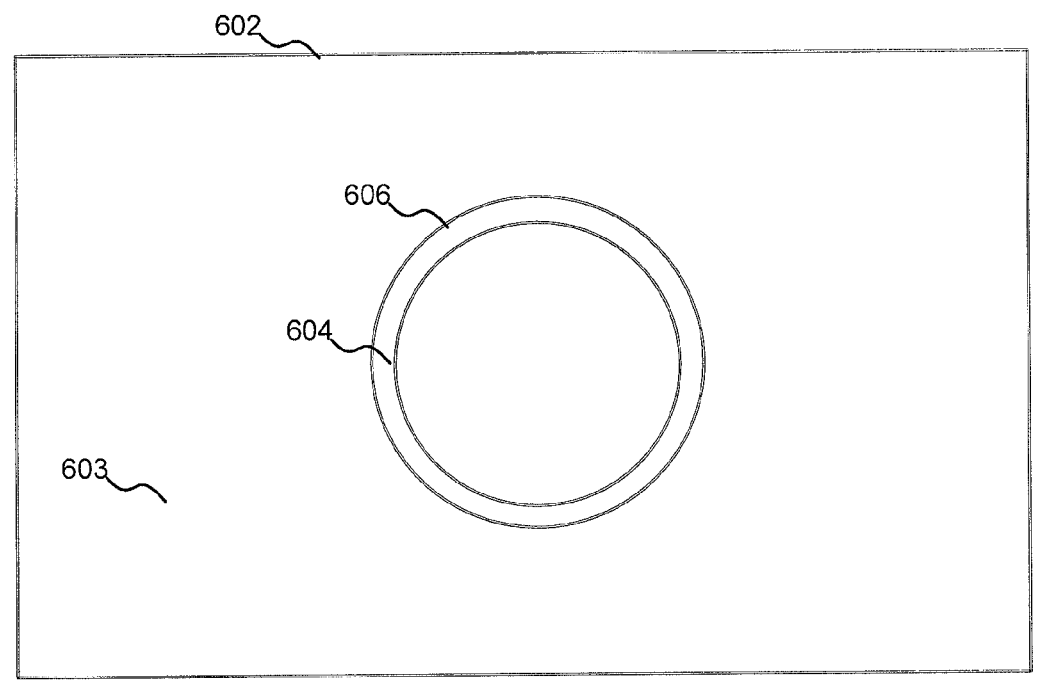
Figure 6C:
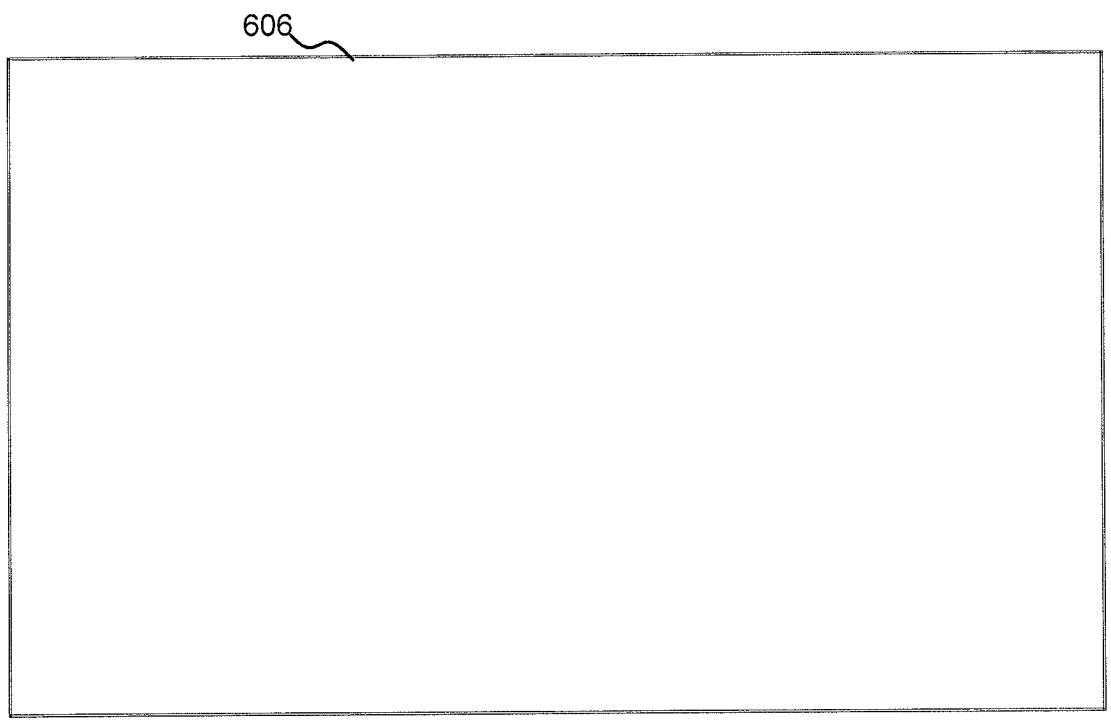

FIGS. 6A-6C illustrate embodiments of optically reflective device 602. As described with respect to FIG. 3, embodiments of the optically reflective device may include a top surface, bottom surface and a body structure, where the top surface may include a capping layer. The optically reflective device may further be configured to be communicatively coupled to an electromagnetic source (e.g. electromagnetic source 310 from FIGS. 3, 4, and 5) configured to reduce contamination on the top surface by applying an electromagnetic field.

In some embodiments, the optically reflective device may be configured to be communicatively coupled to an electromagnetic source through the use of one or more electrical contacts. For example, the top surface of the optically reflective device may comprise a metal capping layer (e.g., ruthenium). In such an embodiment, the capping layer may provide the top surface electrode, and the top surface may be connected to the electromagnetic source using one or more electrical leads. Similarly, the bottom surface may also include a metal layer that may be connected to the electromagnetic source using one or more electrical leads. For example, FIG. 6A provides an illustration of the top side of an embodiment of optically reflective device 602 having an exposed area 604. Electrically conductive top surface/capping layer 603 may be used to communicatively couple reflective device 602 to an electromagnetic source. Moreover, FIG. 6B provides an additional embodiment that also include concentric annular contact 606. Annular contact 606 may also be used to communicatively couple reflective device 606 to an electromagnetic source. FIG. 6C provides an illustration of an embodiment of the bottom side of optically reflective device 602.

Additionally, the optically reflective device may alternatively be communicatively coupled to the electromagnetic source without the use of electrical contacts. For example, an electromagnetic field (having the desired bias) may be generated around the electromagnetic device. In a specific embodiment, the electromagnetic source may generate a magnetic field with a bias perpendicular to the desired electric field.

Figure 1:
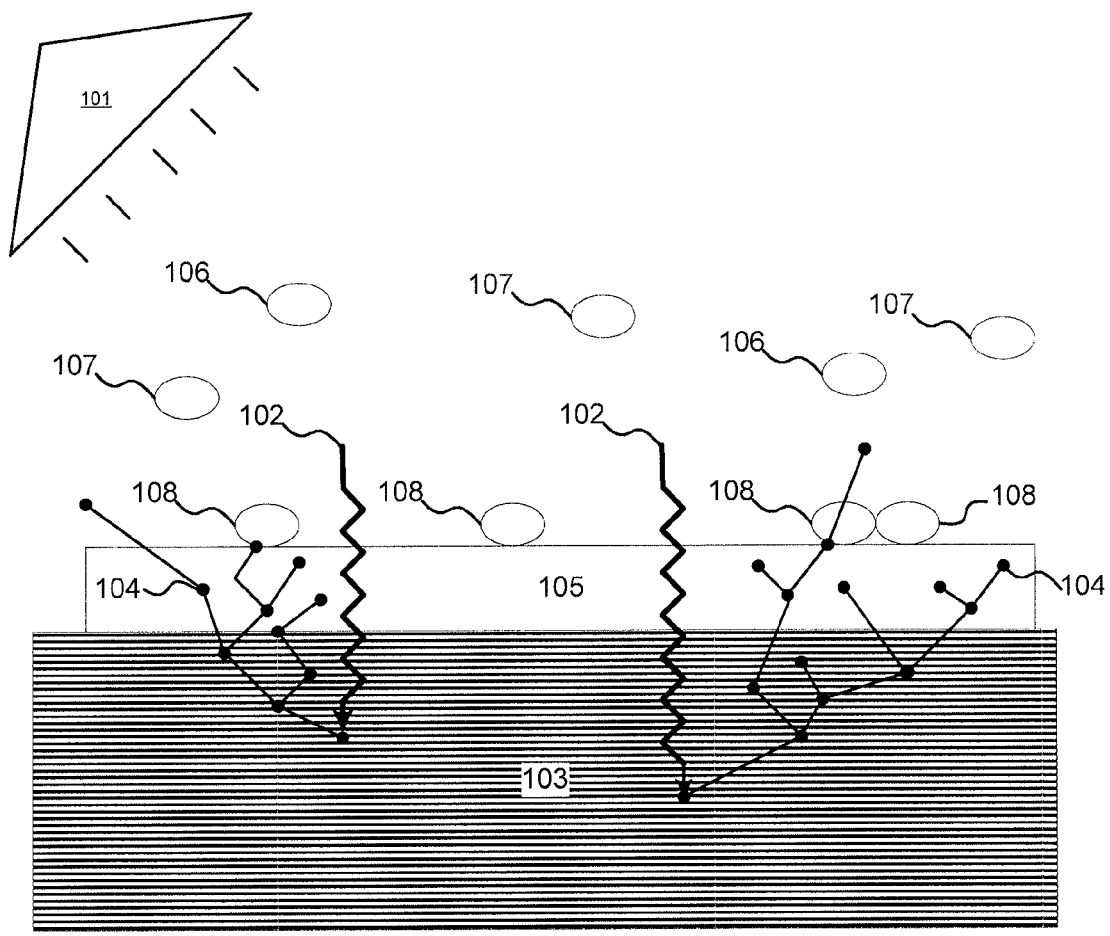
FIG. 1 illustrates the contamination of an EUV optic surface.

An EUV tool for use in EUV applications (e.g., lithography) is also disclosed. For example, such an EUV tool may include an EUV light source (e.g., light source 101 from FIG. 1) configured to emit EUV light radiation. Additionally, such a tool may include one or more EUV optics devices (e.g., EUV optic devices 303 from FIGS. 3, 4, and 5 and EUV optics device 602 from FIGS. 6A-C). As discussed with respect to the optics devices, each individual optics device may be configured to be communicatively coupled to an electromagnetic source that is configured to provide an electromagnetic field that reduces contamination on the optically reflective surface of the optically reflective device by applying an electromagnetic field. In embodiments of the EUV tool having more than one EUV optics device, each EUV optics device may have its own dedicated electromagnetic power source. Alternatively, the EUV tool may a universal electromagnetic power source configured to provide an electromagnetic field to each of the EUV optics devices universally.

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept should be apparent to those skilled in the art from this disclosure.

All of the methods disclosed and claimed herein can be made and executed without undue experimentation in light of the present disclosure. While the devices, tools, and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. An extreme ultraviolet (EUV) tool comprising:
an EUV radiation source;
an optically reflective surface configured to reflect EUV radiation; and
an electromagnetic source communicatively coupled to the optically reflective device and configured to provide an electromagnetic field that reduces contamination on the optically reflective surface by applying an electromagnetic field;
where the EUV tool is configured to minimize the interaction of electrons with the optically reflective surface.

2. The tool of claim 1, the electromagnetic source configured to provide an electromagnetic field through one or more contacts.

3. The tool of claim 1, the electromagnetic field source having a reverse bias.

4. The tool of claim 1, the electromagnetic field source having a forward bias.

5. The tool of claim 1, the electromagnetic field source having an alternating bias.

6. The tool of claim 1, the electromagnetic source generating a pulsed electromagnetic field.

7. An optically reflective device comprising:
a top surface configured to reflect EUV radiation and to be communicatively coupled to an electromagnetic source configured to reduce contamination on the top surface by applying an electromagnetic field to minimize the interaction of electrons with the optically reflective surface;
a bottom surface; and
a body structure.

8. The device of claim 7, the body structure comprising patterned layers of a metal and an insulator.

9. The device of claim 7, the body structure comprising interleaved layers of silicon and molybdenum.

10. The device of claim 7, the top surface comprising one or more electrical contacts connecting the top surface to the electromagnetic source.

11. The device of claim 7, the top surface comprising a capping layer.

12. The device of claim 11, the capping layer comprising ruthenium.

13. The device of claim 7, the bottom surface comprising one or more electrical contacts connecting the bottom surface to the electromagnetic source.

14. A method for mitigating contamination of an optically reflective device comprising:
providing an optically reflective surface configured to reflect EUV radiation;
exposing the optically reflective surface to EUV radiation thereby generating electrons; and
applying an electromagnetic field to the optically reflective surface, the electromagnetic field configured to reduce reactions initiated by the electrons on the optically reflective surface by minimizing the interaction of electrons with the optically reflective surface.

15. The method of claim 14, wherein reducing the surface reactions reduces contamination on the optically reflective surface.

16. The method of claim 14, the electromagnetic field having a forward bias.

17. The method of claim 14, the electromagnetic field having a reverse bias.

18. The method of claim 14, the electromagnetic field being pulsed.

19. The method of claim 14, the electromagnetic field having an alternating bias.

20. An optically reflective device comprising:
a top surface configured to reflect EUV radiation and to be communicatively coupled to an electromagnetic source configured to reduce contamination on the top surface by applying an electromagnetic field, where the top surface comprises an annular contact configured to connect to the electromagnetic source;
a bottom surface; and
a body structure.

* * * * *